(12) United States Patent
Guo et al.

(10) Patent No.: US 12,169,228 B2
(45) Date of Patent: Dec. 17, 2024

(54) MAGNETIC ISOLATOR

(71) Applicant: MultiDimension Technology Co., Ltd., Zhangjiagang (CN)

(72) Inventors: Haiping Guo, Zhangjiagang (CN); Weifeng Shen, Zhangjiagang (CN); Songsheng Xue, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 262 days.

(21) Appl. No.: 17/593,324

(22) PCT Filed: Mar. 12, 2020

(86) PCT No.: PCT/CN2020/078993
§ 371 (c)(1),
(2) Date: Sep. 15, 2021

(87) PCT Pub. No.: WO2020/187127
PCT Pub. Date: Sep. 24, 2020

(65) Prior Publication Data
US 2022/0187389 A1 Jun. 16, 2022

(30) Foreign Application Priority Data
Mar. 15, 2019 (CN) .......................... 201910197873.9

(51) Int. Cl.
*G01R 33/09* (2006.01)
*G01R 33/07* (2006.01)

(52) U.S. Cl.
CPC ........... *G01R 33/093* (2013.01); *G01R 33/07* (2013.01)

(58) Field of Classification Search
CPC .. G01R 33/093; G01R 33/07; G01R 33/0011; G01R 33/007; G01R 33/0076; G01R 33/098; G01R 15/207
See application file for complete search history.

(56) References Cited

U.S. PATENT DOCUMENTS

| 9,488,701 B2 | 11/2016 | Lee et al. |
| 2004/0047084 A1 | 3/2004 | Guo |

(Continued)

FOREIGN PATENT DOCUMENTS

| CN | 201622299 | 11/2010 |
| CN | 102692242 A | 9/2012 |

(Continued)

OTHER PUBLICATIONS

"International Application No. PCT/CN2020/078993, International Search Report and Written Opinion dated Jun. 3, 2020", (dated Jun. 3, 2020), 9 pgs.

*Primary Examiner* — Alvaro E Fortich
(74) *Attorney, Agent, or Firm* — Schwegman Lundberg & Woessner, P.A.

(57) ABSTRACT

The present disclosure discloses a magnetic isolator, including a substrate, a magnetic field generating unit, a magnetic field sensing unit, a shielding layer, and an isolation dielectric, where the magnetic field generating unit includes a current conductor, the current conductor is arranged to extend along a first direction on one side of the substrate, the magnetic field sensing unit and the current conductor are arranged on the same side of the substrate, the magnetic field sensing unit is located on a lateral side of the current conductor, and a distance between the current conductor and the magnetic field sensing unit is greater than 0 along a second direction, where the first direction is perpendicular to the second direction; an isolation dielectric is arranged between the current conductor and the magnetic field sensing unit; and an isolation dielectric is arranged within the distance between the current conductor and the magnetic field sensing unit along the second direction, thereby playing a role in electrical isolation, facilitating improving the isolation strength, and simplifying the process. The shield- (Continued)

ing layer can absorb external interfering magnetic fields, and further improve the signal-to-noise ratio.

10 Claims, 8 Drawing Sheets

(56) References Cited

U.S. PATENT DOCUMENTS

| | | | | |
|---|---|---|---|---|
| 2013/0127454 A1* | 5/2013 | Ungaretti | ............ | G01R 33/0206 |
| | | | | 324/251 |
| 2014/0132250 A1* | 5/2014 | Lee | ....................... | G01R 33/093 |
| | | | | 324/202 |
| 2015/0145504 A1* | 5/2015 | Bai | ....................... | G01R 33/093 |
| | | | | 324/207.13 |
| 2017/0370969 A1* | 12/2017 | Okuyama | ............. | G01R 15/205 |
| 2018/0095145 A1* | 4/2018 | Ausserlechner | ... | G01R 33/0094 |

FOREIGN PATENT DOCUMENTS

| | | |
|---|---|---|
| CN | 103809135 A | 5/2014 |
| CN | 109752578 A | 5/2019 |
| WO | WO-2020187127 A1 | 9/2020 |

\* cited by examiner

MAGNETIC ISOLATOR

PRIORITY CLAIM TO RELATED APPLICATIONS

This application is a U.S. national stage filing under 35 U.S.C. § 371 from International Application No. PCT/CN2020/078993, filed on 12 Mar. 2020, and published as WO2020/187127 on 24 Sep. 2020, which claims the benefit under 35 U.S.C. 119 to Chinese Application No. 201910197873.9, filed on 15 Mar. 2019, the benefit of priority of each of which is claimed herein, and which applications and publication are hereby incorporated herein by reference in their entirety.

TECHNICAL FIELD

The present disclosure relates to the field of magnetic sensors, and in particular to, a magnetic isolator.

BACKGROUND

In an electronic circuit, various signals are likely to interfere with each other. To ensure the signal stability, a signal isolator is often used. At present, a commercial signal isolator includes an optocoupler, a capacitive coupling isolator, and a magnetic isolator, where the magnetic isolator has the characteristics of fast response frequency and easy integration and is widely used at present.

A chip-level transformer technology is used for iCoupler series of products successfully commercialized by ADI, to integrate primary and secondary coils on a semiconductor substrate. Between the primary and secondary coils, polyimide with a high breakdown strength is provided, such that the isolation voltage reaches up to 5000 VRMS/min, and the transmission rate reaches 150 Mbps. Since a transformer only responds to a high-frequency signal, if an input signal is a low-frequency signal, the signal transmission between the primary and the secondary coils can be realized only by processing the raw signal by means of, e.g., chopping.

NVE develops IsoLoop series of products using a giant magnetoresistive (GMR) element, such that the isolation voltage reaches up to 6000V, and the transmission rate also reaches 150 Mbps. A primary coil is provided inside this series of products. A GMR element is provided below the primary coil, and the primary coil generates a horizontal magnetic field at the position of the GMR element. The GMR element detects and outputs the horizontal magnetic field, thereby realizing the isolated transmission of signals. Benzocyclobutene (BCB) having a thickness of 10 μm is provided between the primary coil and the GMR element, thereby achieving an isolation voltage of several kilovolts. The frequency response of the GMR element is from 0 Hz to several MHz, thereby solving the problem that the transformer can only transmit high-frequency signals.

The high isolation voltage of the above two methods is achieved by an isolation layer between a signal transmitting element and a signal receiving element. In order to achieve a high isolation voltage, a material having a high isolation voltage and a relatively thick isolation layer are required. If silicon oxide or aluminum oxide serves as the isolation layer, a relatively long coating time is required, and a relatively high cost is required; and if a polymer material, such as polyimide or BCB, serves as the isolation layer, there is a hidden danger of device failure in some extreme environments, e.g., in the event of moisture or in a high temperature environment.

SUMMARY

In view of the above technical problems, the present disclosure presents a magnetic isolator, including a substrate, a magnetic field generating unit, a magnetic field sensing unit, a shielding layer, and an isolation dielectric, where the magnetic field generating unit includes a current conductor, the current conductor is arranged to extend along a first direction on one side of the substrate, the magnetic field sensing unit is located on a lateral side of the current conductor; and a distance between the current conductor and the magnetic field sensing unit is greater than 0 along a second direction, where the first direction is perpendicular to the second direction. An isolation dielectric is arranged between the current conductor and the magnetic field sensing unit. The isolation dielectric may be an isolating material having a high dielectric strength, and the isolation distance is only related to a horizontal distance between the current conductor and the magnetic field sensing unit. On upper and lower sides of the magnetic field sensing unit, magnetic concentrating sheets are provided to improve output signals of the magnetic field sensing unit. A shielding layer is provided on the upper side and/or the lower side of the magnetic field sensing unit and the current conductor to absorb external interfering magnetic fields and simultaneously prevent the leakage of a magnetic field generated by the current conductor. The magnetic isolator has a simple structure, thereby simplifying the preparation process, and saving the costs.

The present disclosure is implemented using the following technical solutions:

a magnetic isolator includes a substrate, a magnetic field generating unit, a magnetic field sensing unit, a shielding layer, and an isolation dielectric, where the magnetic field generating unit includes a current conductor, the current conductor is arranged to extend along a first direction on one side of the substrate, the magnetic field sensing unit and the current conductor are arranged on the same side of the substrate, the magnetic field sensing unit is located on a lateral side of the current conductor, and a distance between the current conductor and the magnetic field sensing unit is greater than 0 along a second direction, where the first direction is perpendicular to the second direction;

an isolation dielectric is arranged between the current conductor and the magnetic field sensing unit; the current signal includes an input terminal, a current signal inputted from the input terminal flows through the current conductor to generate a magnetic field around the current conductor, the magnetic field has a component in a sensitive direction of the magnetic field sensing unit, and an output signal sensed by the magnetic field sensing unit is directly proportional to the magnetic field generated around the current conductor; and the shielding layer and the magnetic field generating unit are located on the same side of the substrate, and the shielding layer is located on one side of the magnetic field generating unit close to the substrate and/or away from the substrate, to absorb external interfering magnetic fields and prevent leakage of the magnetic field generated around the current conductor of the magnetic field generating unit.

Preferably, the magnetic field generating unit further includes a voltage converting unit, where the voltage converting unit is electrically connected to the input terminal of the current conductor to convert an inputted voltage signal into a current signal.

Preferably, the magnetic isolator further includes a signal processing unit, where the signal processing unit is electrically connected to the magnetic field sensing unit to receive and process an output signal of the magnetic field sensing unit and output the processed signal.

Preferably, the signal processing unit includes a filter module, an amplifying module, a comparing module, and a level converting module successively connected in series, where the filter module is electrically connected to the magnetic field sensing unit.

Preferably, the magnetic field sensing unit is composed of a giant magnetoresistive element, where a magnetization direction of a pinning layer of the giant magnetoresistive element is perpendicular to surface of the giant magnetoresistive element, and a sensitive direction of the giant magnetoresistive element is perpendicular to the surface of the giant magnetoresistive element; or the pinning layer of the giant magnetoresistive element is parallel to the surface of the giant magnetoresistive element, and the sensitive direction of the giant magnetoresistive element is parallel to the surface of the giant magnetoresistive element.

Preferably, the magnetic field sensing unit is composed of a tunnel magnetoresistive element, where a magnetization direction of a pinning layer of the tunnel magnetoresistive element is perpendicular to surface of the tunnel magnetoresistive element, and a sensitive direction of the tunnel magnetoresistive element is perpendicular to the surface of the tunnel magnetoresistive element; or the pinning layer of the tunnel magnetoresistive element is parallel to the surface of the tunnel magnetoresistive element, and the sensitive direction of the tunnel magnetoresistive element is parallel to the surface of the tunnel magnetoresistive element.

Preferably, the magnetic field sensing unit is composed of a Hall element or an anisotropic magnetoresistive element.

Preferably, the magnetic isolator further includes magnetic concentrating sheets arranged on a first side and a second side of the magnetic field sensing unit, where the first side and the second side are two opposite sides of the magnetic field sensing unit, a connection direction from the first side to the second side is the same as or opposite to the sensitive direction of the magnetic field sensing unit, and the magnetic concentrating sheets are configured to enhance a magnetic field signal generated by the current conductor and a signal-to-noise ratio of the magnetic isolator.

Preferably, a material of the magnetic concentrating sheets and the shielding layer includes at least one of permalloy, industrial pure iron, and ferrite.

Preferably, a silicon substrate, a quartz substrate, or a glass substrate is employed for the substrate, and the isolation dielectric includes at least one of aluminum oxide, silicon oxide, silicon nitride, polyimide, and benzocyclobutene.

Compared with the prior art, the present disclosure has the following beneficial technical effects.

An isolation dielectric is provided within the distance between the current conductor and the magnetic field sensing unit in the second direction (in the horizontal direction for a horizontally placed magnetic isolator) of the magnetic isolator provided in the present disclosure, thereby playing a role in electrical isolation, facilitating improving the isolation strength, and simplifying the process. The shielding layer can absorb external interfering magnetic fields, and further improve the signal-to-noise ratio.

BRIEF DESCRIPTION OF THE DRAWINGS

After reading detailed description of non-limiting embodiments with reference to the following accompanying drawings, other features, objectives, and advantages of the present disclosure will become more apparent.

DETAILED DESCRIPTION

The present disclosure will be described in detail below in conjunction with the specific embodiments. The following embodiments will help those skilled in the art to further understand the present disclosure, but do not impose any limitation on the present disclosure. It should be noted that those of ordinary skills in the art may further make some improvements and modifications without departing from the principle of the present disclosure. All these improvements and modifications fall within the scope of protection of the present disclosure.

Figure 1:
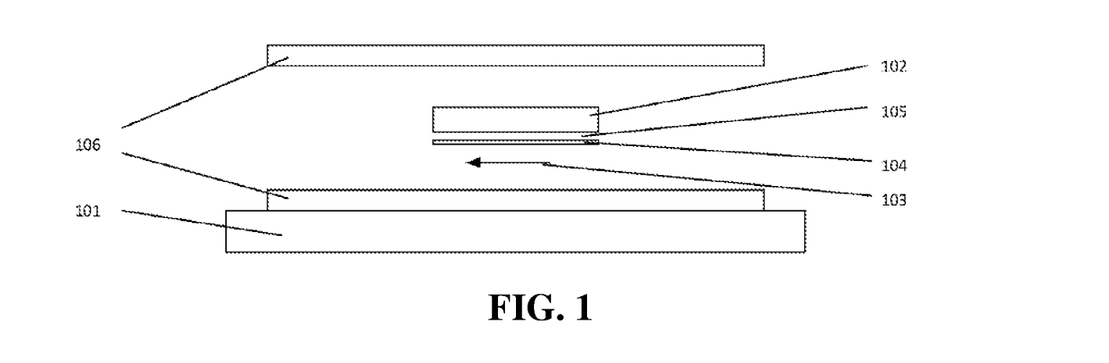
FIG. 1 is a schematic sectional view of a conventional magnetic isolator in the prior art.

FIG. 1 is a schematic sectional view of a conventional magnetic isolator in the prior art. All components are deposited on a substrate 101 by a semiconductor process or MEMS process. A current signal is inputted into a current conductor 102, and description is given below with the direction of the current signal being inwardly perpendicular to the paper surface. The magnitude of the current signal is related to the magnitude of the measured current. A magnetic field sensing unit 104 is directly below the current conductor 102, and the direction of the magnetic field generated by the current conductor 102 at the position of the magnetic field sensing unit 104 is as shown by an arrow 103 in the figure. The magnetic field sensing unit 104 senses the magnetic field, and outputs the magnetic field in a voltage mode. An isolation dielectric 105 is provided between the current conductor 102 and the magnetic field sensing unit 104, and the material and thickness of the isolation dielectric determine the isolation voltage. In order to enhance the suppression of an external field and reduce the leakage of the magnetic field, shielding layers 106 are provided on upper and lower sides of the current conductor 102 and the magnetic field sensing unit 104. In order to achieve a relatively high isolation voltage, a relatively thick isolation dielectric is usually required. If silicon oxide or aluminum oxide serves as the isolation layer, a relatively long coating time is required, and a relatively high cost is required; and if a polymer material, such as polyimide or BCB, serves as the isolation layer, there is a hidden danger of device failure in some extreme environments, e.g., in the event of moisture or in a high temperature environment.

Figure 2:
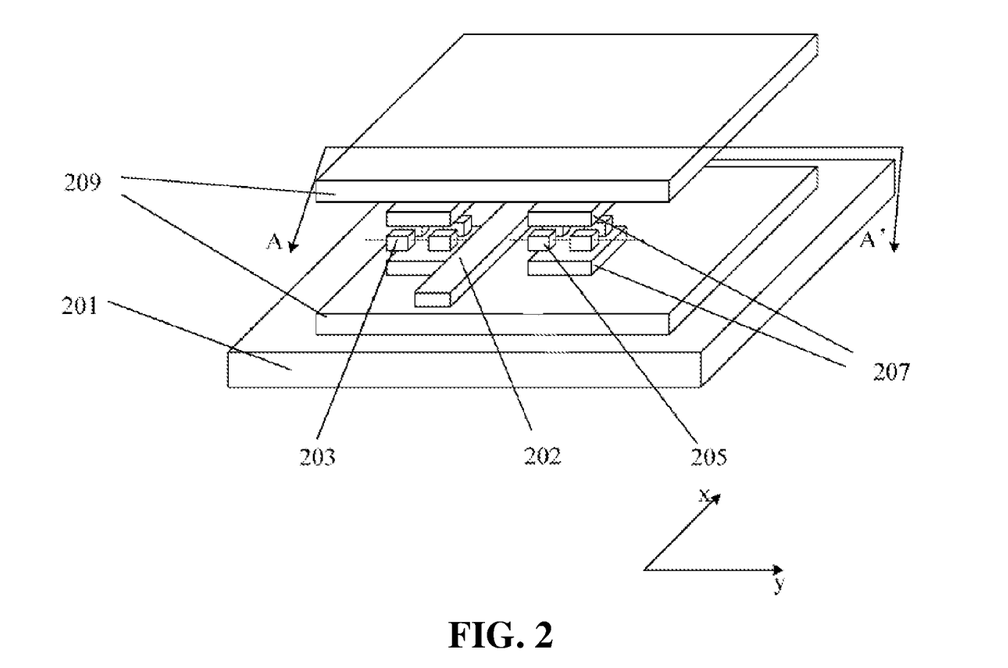
FIG. 2 is a schematic stereostructural diagram of a magnetic isolator provided in an embodiment of the present disclosure.
Figure 3:
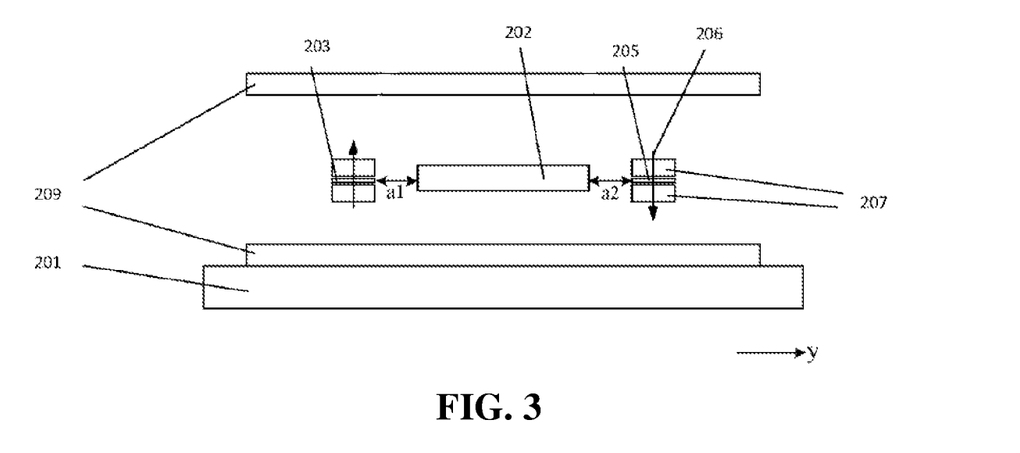
FIG. 3 is a sectional view of a magnetic isolator presented in the present disclosure.

In view of the above problems, an embodiment of the present disclosure presents a magnetic isolator. FIG. 2 is a schematic stereostructural diagram of a magnetic isolator provided in an embodiment of the present disclosure. FIG. 3 is a sectional view of a magnetic isolator presented in the present disclosure, and a section line corresponding to its section is A-A'. Referring to FIG. 2 and FIG. 3, the magnetic isolator includes a substrate 201, a magnetic field generating unit, a magnetic field sensing unit 203, a shielding layer 209, and an isolation dielectric. The magnetic field generating unit includes a current conductor 202. The current conductor 202 is arranged to extend along a first direction x on one side of the substrate 201, the magnetic field sensing unit 203 and the current conductor 202 are arranged on the same side of the substrate 201, the magnetic field sensing unit 203 is located on a lateral side of the current conductor 202, and a distance between the current conductor 202 and the magnetic field sensing unit 203 is greater than 0 along a second direction y, where the first direction x is perpendicular to the second direction y; an isolation dielectric is arranged between the current conductor 202 and the magnetic field sensing unit 203; the current conductor includes an input terminal, a current signal inputted from the input terminal flows through the current conductor 202 to generate a magnetic field around the current conductor 202, the magnetic field has a component in a sensitive direction of the magnetic field sensing unit 203, and an output signal sensed by the magnetic field sensing unit 203 is directly proportional to the magnetic field generated around the current conductor 202; and the shielding layer 209 and the magnetic field generating unit 203 are located on the same side of the substrate 201, and the shielding layer is located on one side of the magnetic field generating unit close to the substrate 201 and/or away from the substrate 201, to absorb external interfering magnetic fields and prevent the leakage of the magnetic field generated around the current conductor 202.

An isolation voltage between the current conductor 202 and the magnetic field sensing unit 203 is directly proportional to a spacing distance between the current conductor 202 and the magnetic field sensing unit 203. The spacing distance refers to the length of the connection between the current conductor 202 and the magnetic field sensing unit 203.

Referring to FIG. 2 and FIG. 3, specifically, the current conductor 202 is provided on one side of the substrate 201, and an isolation dielectric may be provided between the current conductor 202 and the shielding layer 209. Magnetic field sensing units 203 and 205 are provided on a lateral side of the current conductor 202. At the positions of the two magnetic field sensing units, the directions of the magnetic fields generated by the current signal are arrows 204 and 206 in the figure respectively, and the directions of the two arrows are also the sensitive directions of the magnetic field sensing units 203 and 205. For a specific current value, when the output signals of the magnetic field sensing units 203 and 205 are different, the isolated output of the signal can be realized.

A spacing distance between the current conductor 202 and the magnetic field sensing unit 203 along the second direction is a1, and a spacing distance between the current conductor 202 and the magnetic field sensing unit 205 is a2, where a1 and a2 are greater than 0, the magnitude of the isolation voltage is related to the length of the spacing distance, and the isolation voltage can be increased by increasing the length of the spacing, which is very easily achieved in the process. In addition, in order to enhance the suppression of an external field and reduce the leakage of the magnetic field, shielding layers 209 are provided on one side of the current conductor 202 and the magnetic field sensing units 203 and 205 close to the substrate 201 and/or away from the substrate 201, i.e., upper and lower sides in FIG. 3.

Further referring to FIG. 2 and FIG. 3, on the basis of the above solutions, the magnetic isolator further includes magnetic concentrating sheets 207. The magnetic concentrating sheets 207 are arranged on a first side and a second side of the magnetic field sensing unit, where the first side and the second side are two opposite sides of the magnetic field sensing unit, a connection direction from the first side to the second side is the same as or opposite to the sensitive direction of the magnetic field sensing unit, and the magnetic concentrating sheets 207 are configured to enhance a magnetic field signal of the magnetic field sensing unit and a signal-to-noise ratio of the magnetic isolator.

For example, for a horizontally placed magnetic isolator in FIG. 3, a first side of the magnetic field sensing unit may be an upper side of a magnetic sensing unit, and a second side may be a lower side of the magnetic sensing unit; or a first side of the magnetic field sensing unit may be a lower side of a magnetic sensing unit, and a second side may be an upper side of the magnetic sensing unit. The magnetic concentrating sheets 207 are provided on the first side and the second side of the magnetic field sensing unit, to increase the magnetic field intensity at the magnetic field sensing unit, and such that the magnetic field direction is along the sensitive direction of the magnetic field sensing unit.

The magnetic isolator provided in embodiments of the present disclosure includes a substrate, a magnetic field generating unit, a magnetic field sensing unit, a shielding layer, and an isolation dielectric, where the magnetic field generating unit includes a current conductor, the current conductor is arranged to extend along a first direction on one side of the substrate, the magnetic field sensing unit and the current conductor are arranged on the same side of the substrate, the magnetic field sensing unit is located on a lateral side of the current conductor, and a distance between the current conductor and the magnetic field sensing unit is greater than 0 along a second direction, where the first direction is perpendicular to the second direction; an isolation dielectric is arranged between the current conductor and the magnetic field sensing unit; and an isolation dielectric is arranged within the distance between the current conductor and the magnetic field sensing unit along the second direction, thereby playing a role in electrical isolation, facilitating improving the isolation strength, and simplifying the process. The shielding layer can absorb external interfering magnetic fields, and further improve the signal-to-noise ratio.

On the basis of the above solutions, a material of the magnetic concentrating sheets and the shielding layer includes at least one of permalloy, industrial pure iron, and ferrite. A silicon substrate, a quartz substrate, or a glass substrate is employed for the substrate. The isolation dielectric includes at least one of aluminum oxide, silicon oxide, silicon nitride, polyimide, and benzocyclobutene.

Figure 4:
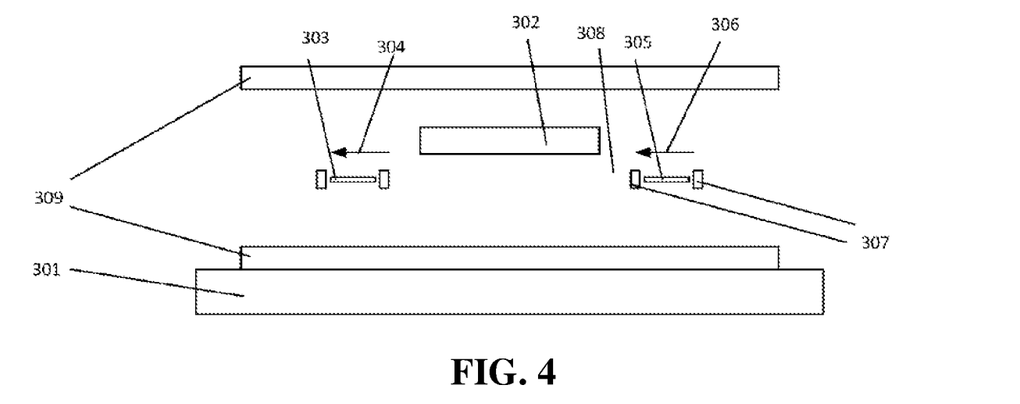
FIG. 4 is a schematic sectional view of another magnetic isolator presented in the present disclosure.

FIG. 4 is a schematic sectional view of another magnetic isolator presented in the present disclosure. Under certain process conditions, a current conductor 302 will deviate from center lines of magnetic field sensing units 303 and 305 in the height direction, and description is given still with the current direction in the current conductor 302 being inwardly perpendicular to the paper surface as an example. In this case, there are horizontal components in the magnetic field sensing units 303 and 305, as shown by arrows 304 and 306 in the figure. In this design, sensitive directions of the magnetic field sensing units 303 and 305 are the horizontal direction (taking a horizontally placed magnetic isolator as an example). On upper and lower sides of the magnetic field sensing units 303 and 305, magnetic concentrating sheets 307 may be additionally provided to increase the magnetic field intensity at the magnetic field sensing units and improve the signal output.

Figure 5:
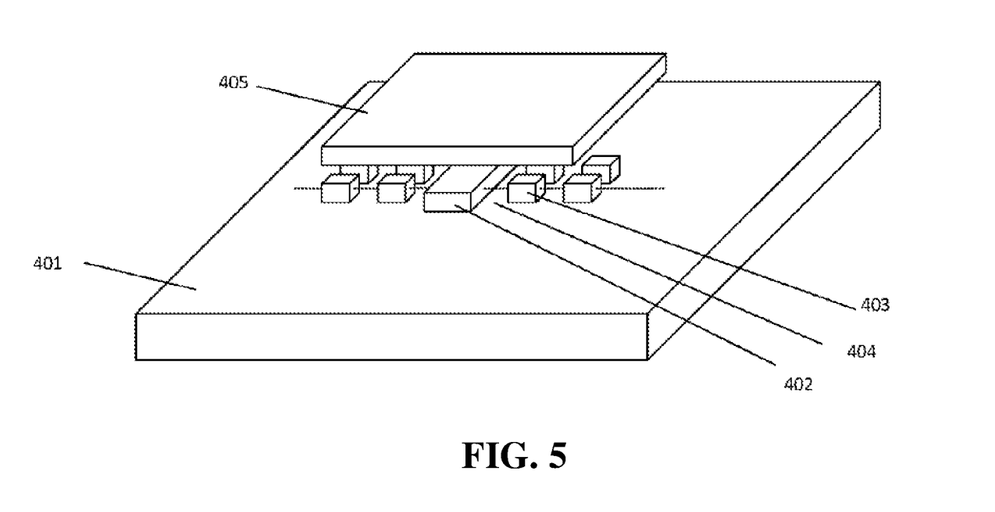
FIG. 5 is a schematic stereostructural diagram of another magnetic isolator provided in an embodiment of the present disclosure.
Figure 6:
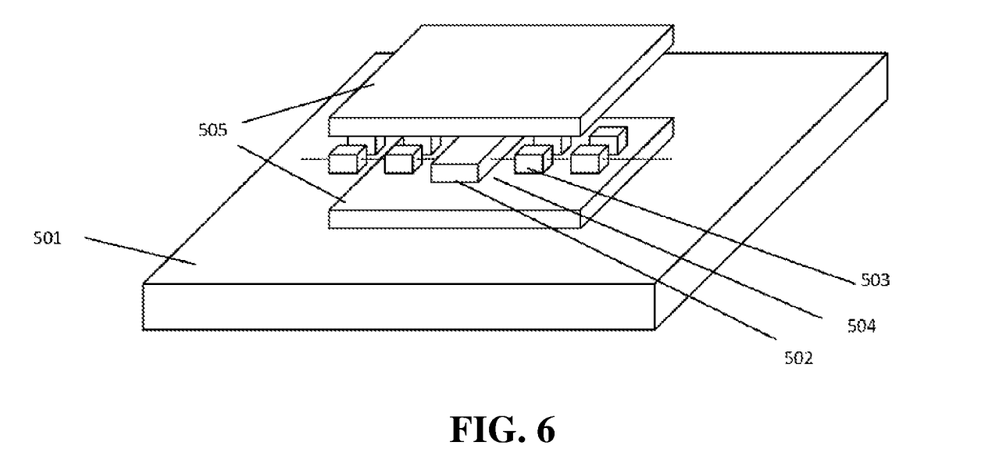
FIG. 6 is a schematic stereostructural diagram of still another magnetic isolator provided in an embodiment of the present disclosure.

FIG. 5 is a schematic stereostructural diagram of another magnetic isolator provided in an embodiment of the present disclosure; and FIG. 6 is a schematic stereostructural diagram of still another magnetic isolator provided in an embodiment of the present disclosure.

In FIG. 5, 401 is a substrate, a magnetic field sensing unit is located on a lateral side of a current conductor 402, and the magnetic field sensing unit is an M*N array composed of a plurality of magnetic sensing elements 403, where M and N are integers greater than or equal to 1, and an isolation dielectric is provided within a spacing distance between the current conductor 402 and the magnetic sensing element 403, thus forming a magnetic isolator. In addition, in order to reduce the interference of an external magnetic field and reduce the leakage of the magnetic field, shielding layers 405 with a high magnetic permeability are provided above the magnetic field sensing unit and above the current conductor 402.

Compared with the magnetic isolator in FIG. 5, the magnetic isolator in FIG. 6 has upper and lower shielding layers 505 with a high magnetic permeability and has a better shielding effect.

Figure 7:
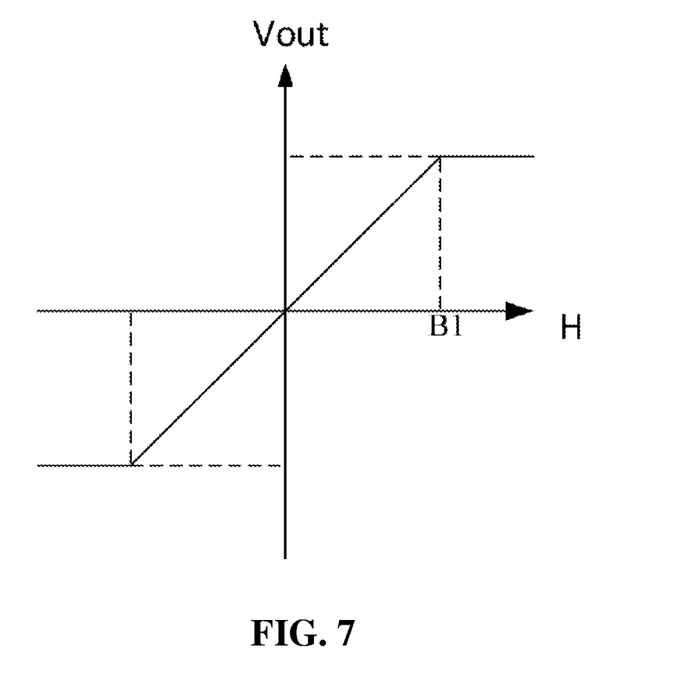
FIG. 7 is a schematic diagram of an output curve of a magnetic field sensing unit provided in an embodiment of the present disclosure.

FIG. 7 is schematic diagram of an input and output curve of a magnetic field sensing unit provided in an embodiment of the present disclosure, where the abscissa denotes magnetic field signals generated by the current around a current conductor, and the ordinate denotes output voltages of a full bridge-structured magnetic field sensing unit. The magnetic field sensing unit has a saturated magnetic field B1. As long as the absolute value of the magnetic field is smaller than the saturated magnetic field B1, the output voltage of the magnetic field sensing unit is directly proportional to the magnetic field signal, and the magnetic field signal is directly proportional to the current signal. Therefore, the output voltage of the magnetic sensing unit is directly proportional to the current signal.

Figure 8:
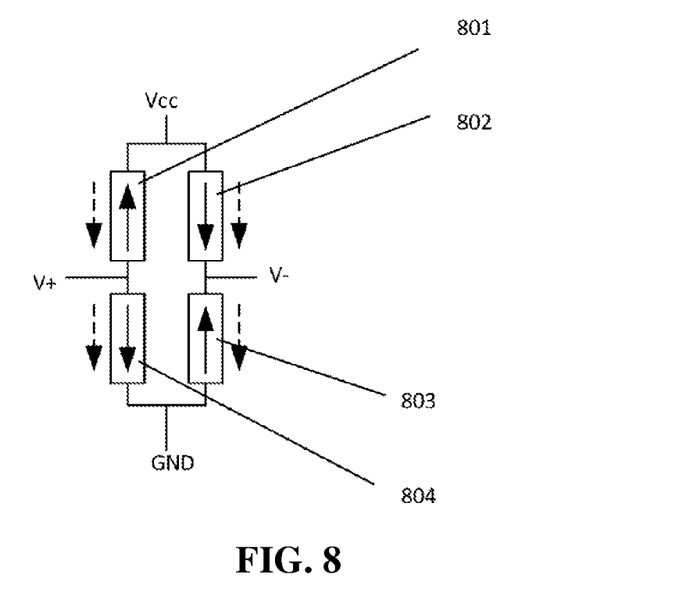
FIG. 8 is a schematic circuit diagram of a bridge-structured magnetic field sensing unit provided in an embodiment of the present disclosure.

FIG. 8 is a schematic circuit diagram of a bridge-structured magnetic field sensing unit provided in an embodiment of the present disclosure, where 801 to 804 represent four magnetic sensing resistors, each of the magnetic sensing resistors is composed of several magnetic sensing elements, solid arrows are sensitive directions of the four magnetic sensing resistors, and dotted arrows are magnetic field directions at positions of the four magnetic sensing resistors. Since the sensitive directions of the four magnetic sensing resistors are opposite to each other pairwise, when a magnetic field is applied to the four magnetic sensing resistors, a differential output signal is formed, and the output curve as shown in FIG. 7 may be obtained.

Figure 9:
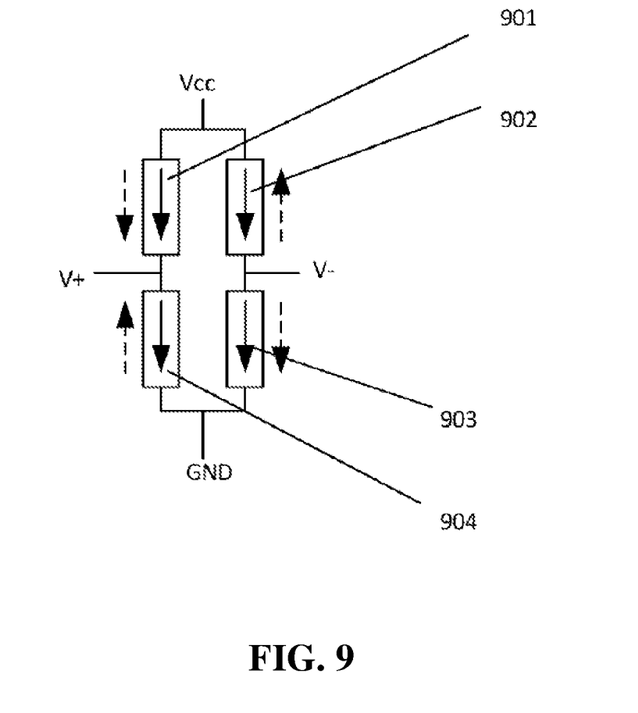
FIG. 9 is a schematic circuit diagram of another bridge-structured magnetic field sensing unit provided in an embodiment of the present disclosure.

FIG. 9 is a schematic structural diagram of another bridge-structured magnetic field sensing unit provided in an embodiment of the present disclosure. Four magnetic sensing resistors 901 to 904 have the same sensitive direction. Based on layout design, magnetic fields at positions of the four magnetic sensing resistors may be made opposite to each other pairwise, and the output curve as shown in FIG. 7 may be obtained as well. Due to the same sensitive direction, this bridge structure can reduce the interference of external common mode magnetic fields.

Figure 10:
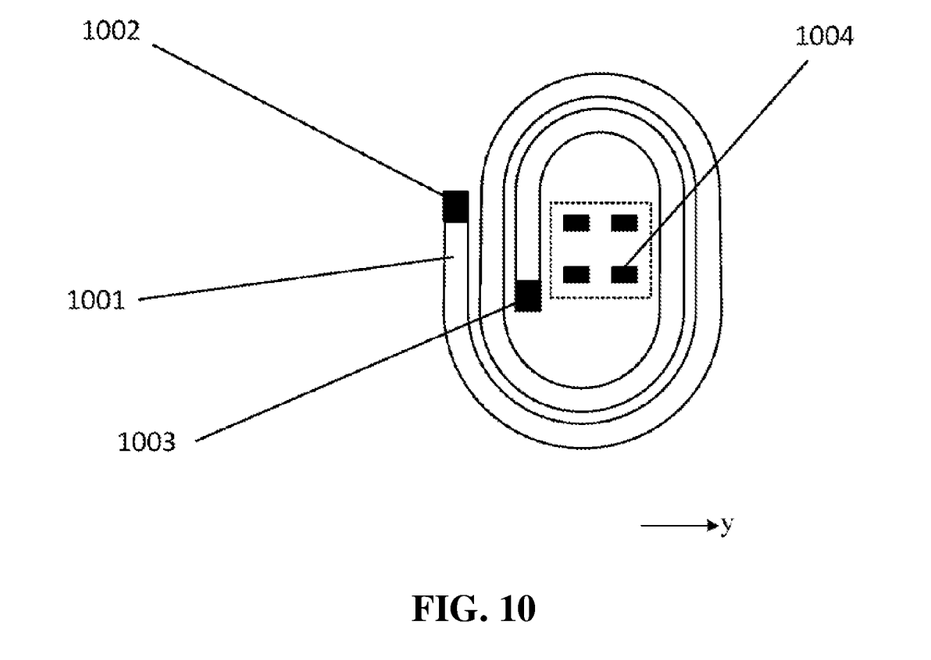
FIG. 10 is a schematic diagram of a position relationship between a current conductor and a magnetic field sensing unit provided in an embodiment of the present disclosure.
Figure 11:
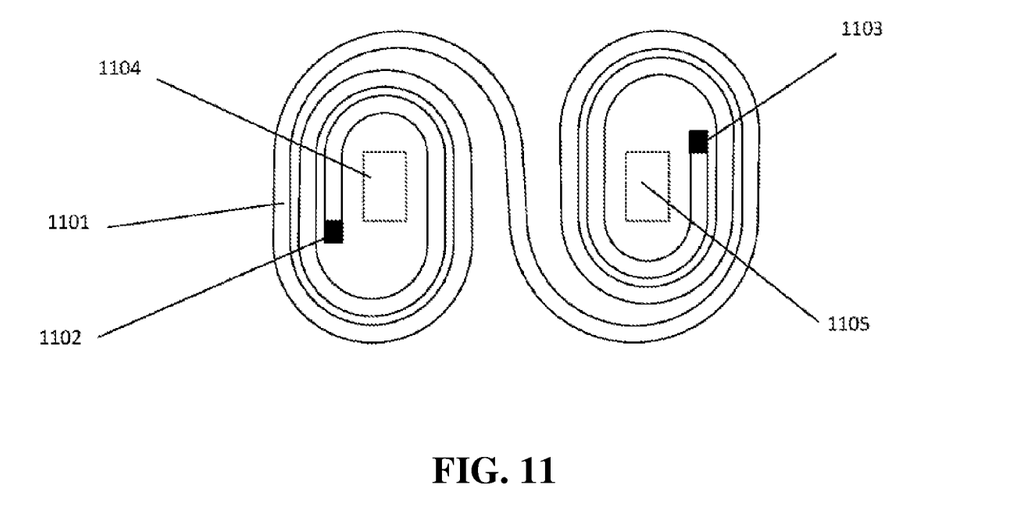
FIG. 11 is a schematic diagram of another position relationship between a current conductor and a magnetic field sensing unit provided in an embodiment of the present disclosure.
Figure 12:
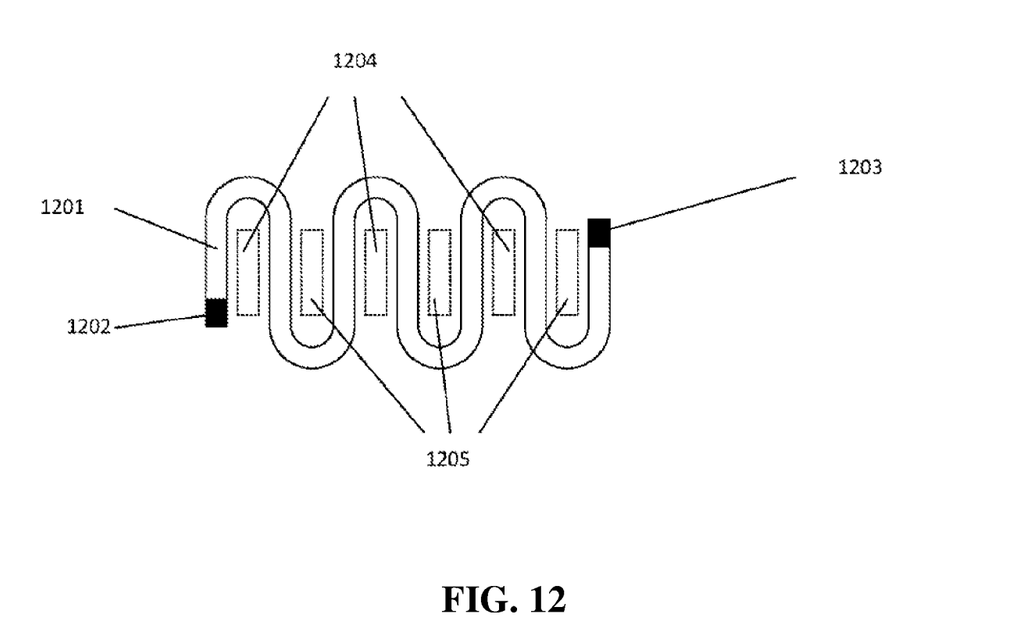
FIG. 12 is a schematic diagram of still another position relationship between a current conductor and a magnetic field sensing unit provided in an embodiment of the present disclosure.

It should be noted that a current conductor may be, e.g., strip-shaped or spiral coil-shaped, which is not specifically limited here in the present disclosure. FIG. 10 to FIG. 12 are diagrams of three typical position relationships between a current conductor and a magnetic field sensing unit.

FIG. 10 is a schematic diagram of a position relationship between a current conductor and a magnetic field sensing unit provided in an embodiment of the present disclosure. Referring to FIG. 10, a dotted block 1004 in FIG. 10 denotes a position where the magnetic field sensing unit is located, and a current conductor 1001 includes two ports 1002 and 1003. When a current flows through the current conductor 1001, there are magnetic fields in the same direction within the dotted block 1004, where the magnetic fields are of the same magnitude and in the same direction. When four magnetic sensing resistors are placed within the dotted block, and a sensitive direction of each of the magnetic sensing resistors is opposite to sensitive directions of adjacent magnetic sensing resistors, the bridge structure as shown in FIG. 8 may be formed. It should be noted that when the current conductor is coil-shaped, the two ports 1002 and 1003 of the coil serve as an input terminal and an output terminal of the current conductor, respectively. A magnetic sensing unit is on a lateral side of the current conductor, and a distance between the magnetic field sensing unit and the input terminal or output terminal of the current conductor is greater than 0 in a second direction.

FIG. 11 is a schematic diagram of another position relationship between a current conductor and a magnetic field sensing unit provided in an embodiment of the present disclosure. Referring to FIG. 11, a current conductor 1101 also has two ports 1102 and 1103. When a current flows through the current conductor 1101, magnetic fields within dotted blocks 1103 and 1104 are of the same magnitude and in opposite directions. When magnetic sensing resistors of the same sensitivity are placed within the dashed blocks 1103 and 1104, the number of magnetic sensing resistors may be determined as actually required, and the bridge structure as shown in FIG. 9 may be formed.

FIG. 12 is a schematic diagram of another position relationship between a current conductor and a magnetic field sensing unit provided in an embodiment of the present disclosure. Referring to FIG. 12, there are several dotted blocks in FIG. 12, and a current conductor 1201 also includes two ports 1202 and 1203. When a current flows through the current conductor 1201, magnetic fields within dotted blocks 1204 and 1205 are of the same magnitude and in opposite directions. When magnetic sensing resistors of the same sensitivity are placed within the dashed blocks 1204 and 1205, the bridge structure as shown in FIG. 9 may be formed.

Figure 13:
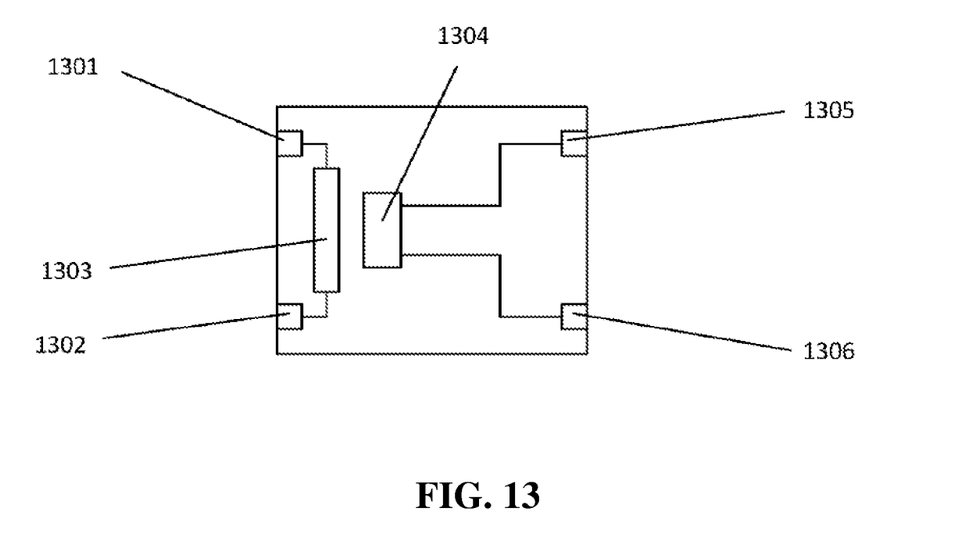
FIG. 13 is a schematic diagram of an electrical structure of a magnetic isolator with a resistor value output provided in an embodiment of the present disclosure.
Figure 14:
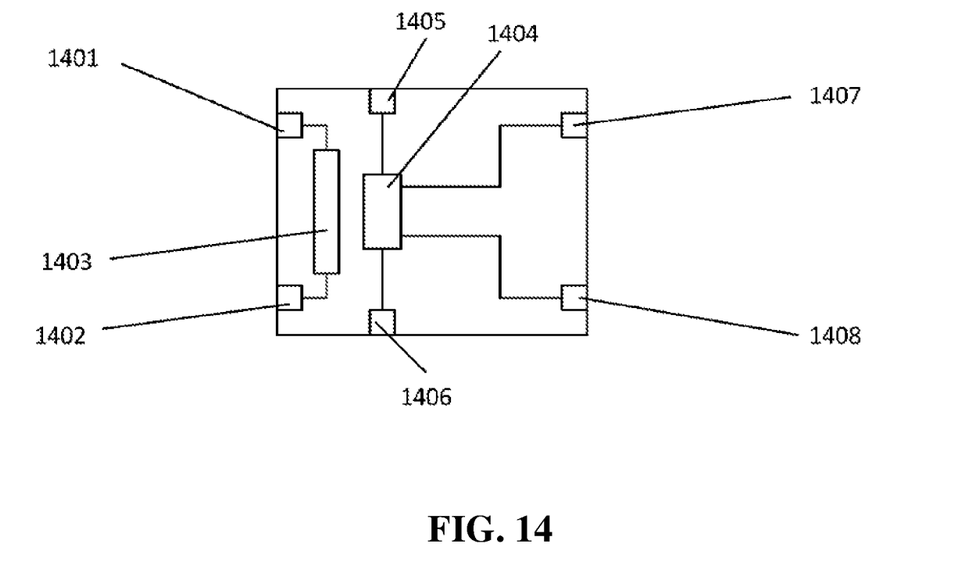
FIG. 14 is a schematic diagram of an electrical structure of a magnetic isolator with a bridged voltage output provided in an embodiment of the present disclosure.
Figure 15:
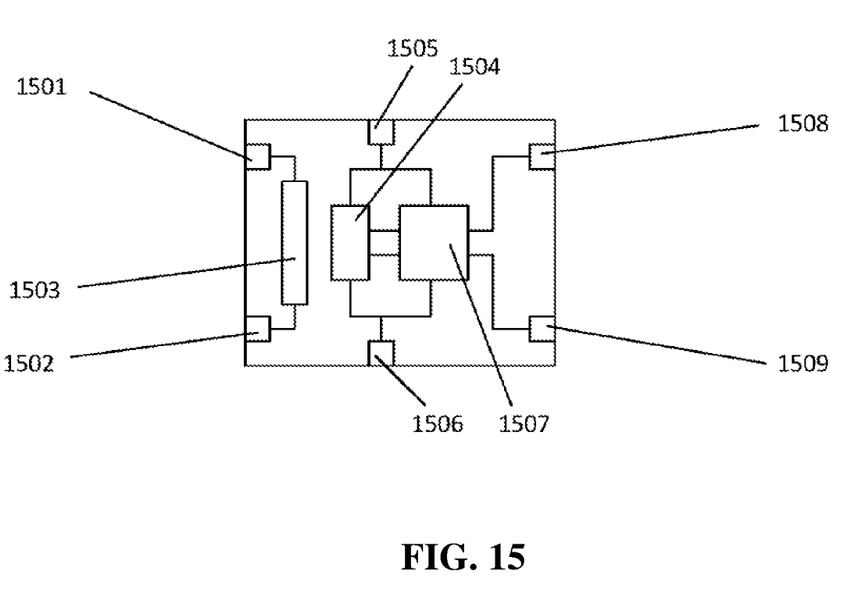
FIG. 15 is a schematic diagram of an electrical structure of a magnetic isolator with signal processing provided in an embodiment of the present disclosure.

FIG. 13 to FIG. 15 are three magnetic isolators in output forms.

FIG. 13 is a schematic diagram of an electrical structure of a magnetic isolator with a resistor value output provided in an embodiment of the present disclosure. FIG. 13 is a magnetic isolator in the form of resistance value output. In the figure, 1301 and 1302 are signal input terminals of the isolator, and a current conductor is provided within a magnetic field generating unit 1303. When there is an input signal, the current conductor generates a magnetic field. A magnetic field sensing unit 1304 (a resistor array composed of Hall, AMR, GMR, or TMR resistors) senses the magnetic field and changes the resistance value, and the resistance value is outputted through output ports 1305 and 1306.

According to a specific embodiment of the present disclosure, the magnetic field sensing unit is composed of a giant magnetoresistive (GMR) element, where a magnetization direction of a pinning layer of the GMR element is perpendicular to surface of the GMR element, and a sensitive direction of the GMR element is perpendicular to the surface of the GMR element; or the pinning layer of the GMR element is parallel to the surface of the GMR element, and the sensitive direction of the GMR element is parallel to the surface of the TMR or GMR element.

According to another specific embodiment of the present disclosure, the magnetic field sensing unit is composed of a tunnel magnetoresistive (TMR) element, where a magnetization direction of a pinning layer of the TMR element is perpendicular to surface of the TMR element, and a sensitive direction of the TMR element is perpendicular to the surface of the TMR element; or the pinning layer of the TMR element is parallel to the surface of the TMR element, and the sensitive direction of the TMR element is parallel to the surface of the TMR element.

According to another embodiment of the present disclosure, the magnetic field sensing unit is composed of a Hall element or an anisotropic magnetoresistive element.

FIG. 14 is a schematic diagram of an electrical structure of a magnetic isolator with a bridged voltage output provided in an embodiment of the present disclosure. In the figure, 1401 and 1402 are signal input terminals of the isolator, and a current conductor is provided within a magnetic field generating unit 1403. When there is an input signal, the current conductor generates a magnetic field. A magnetic field sensing unit 1404 has a half-bridge circuit structure or a full-bridge circuit structure and outputs a voltage signal, where ports 1405 and 1406 are power supply terminals of the magnetic field sensing unit, and ports 1407 and 1408 are voltage output terminals of the magnetic field sensing unit.

Alternatively, the magnetic isolator further includes a signal processing unit, where the signal processing unit is electrically connected to the magnetic field sensing unit to receive and process an output signal of the magnetic field sensing unit and output the processed signal. The signal processing unit includes a filter module, an amplifying module, a comparing module, and a level converting module successively connected in series, where the filter module is electrically connected to the magnetic field sensing unit.

FIG. 15 is a schematic diagram of an electrical structure of a magnetic isolator with signal processing provided in an embodiment of the present disclosure. In the figure, 1501 and 1502 are signal input terminals of the isolator, a voltage or current signal is inputted into the signal input terminals, and a current conductor is provided within a magnetic field generating unit 1503. When there is an input signal, the current conductor generates a magnetic field. A magnetic field sensing unit 1504 has a half-bridge circuit structure or a full-bridge circuit structure and outputs a voltage signal. A signal processing unit 1507 receives an output signal of the magnetic field sensing unit 1504, processes the output signal of the magnetic field sensing unit 1504, and outputs the processed output signal from ports 1508 and 1509. Ports 1505 and 1506 are power supply terminals of the magnetic field generating unit and the signal processing unit.

All other embodiments obtained by those of ordinary skills in the art based on the embodiments of the present disclosure without making creative work fall within the scope of protection of the present disclosure. Although the present disclosure has been illustrated and described in terms of preferred embodiments, those skilled in the art should understand that various alterations and modifications may be made to the present disclosure within the scope defined in the appended claims of the present disclosure.

The invention claimed is:

1. A magnetic isolator, comprising:
   a substrate;
   a magnetic field generating unit;
   a magnetic field sensing unit;
   a shielding layer; and
   an isolation dielectric,
   wherein the magnetic field generating unit comprises a current conductor, the current conductor is arranged to extend along a first direction on one side of the substrate, the magnetic field sensing unit and the current conductor are arranged on the same side of the substrate, the magnetic field sensing unit is located on a lateral side of the current conductor, and a distance between the current conductor and the magnetic field sensing unit is greater than 0 along a second direction, wherein the first direction is perpendicular to the second direction;
   an isolation dielectric is arranged between the current conductor and the magnetic field sensing unit; the current conductor comprises an input terminal, a current signal inputted from the input terminal flows through the current conductor to generate a magnetic field around the current conductor, the magnetic field has a component in a sensitive direction of the magnetic field sensing unit, and an output signal sensed by the magnetic field sensing unit is directly proportional to the magnetic field generated around the current conductor; and
   the shielding layer and the magnetic field generating unit are located on the same side of the substrate, and the shielding layer is located on one side of the magnetic field generating unit close to the substrate and/or away from the substrate, to absorb external interfering magnetic fields and prevent leakage of the magnetic field generated around the current conductor of the magnetic field generating unit.

2. The magnetic isolator according to claim 1, wherein the magnetic field generating unit further comprises a voltage converting unit, wherein the voltage converting unit is electrically connected to the input terminal of the current conductor to convert an inputted voltage signal into a current signal.

3. The magnetic isolator according to claim 1, wherein the magnetic isolator further comprises a signal processing unit, wherein the signal processing unit is electrically connected to the magnetic field sensing unit to receive and process an output signal of the magnetic field sensing unit, and output the processed signal.

4. The magnetic isolator according to claim 3, wherein the signal processing unit comprises a filter module, an amplifying module, a comparing module, and a level converting module successively connected in series, wherein the filter module is electrically connected to the magnetic field sensing unit.

5. The magnetic isolator according to claim 1, wherein the magnetic field sensing unit is comprised of a giant magnetoresistive element, wherein a magnetization direction of a pinning layer of the giant magnetoresistive element is perpendicular to the surface of the giant magnetoresistive element, and a sensitive direction of the giant magnetoresistive element is perpendicular to the surface of the giant magnetoresistive element; or the pinning layer of the giant magnetoresistive element is parallel to the surface of the giant magnetoresistive element, and the sensitive direction of the giant magnetoresistive element is parallel to the surface of the giant magnetoresistive element.

6. The magnetic isolator according to claim 1, wherein the magnetic field sensing unit is comprised of a tunnel magnetoresistive element, wherein a magnetization direction of a pinning layer of the tunnel magnetoresistive element is perpendicular to surface of the tunnel magnetoresistive element, and a sensitive direction of the tunnel magnetoresistive element is perpendicular to the surface of the tunnel magnetoresistive element; or the pinning layer of the tunnel magnetoresistive element is parallel to the surface of the tunnel magnetoresistive element, and the sensitive direction of the tunnel magnetoresistive element is parallel to the surface of the tunnel magnetoresistive element.

7. The magnetic isolator according to claim 1, wherein the magnetic field sensing unit is comprised of a Hall element or an anisotropic magnetoresistive element.

8. The magnetic isolator according to claim 1, wherein the magnetic isolator further comprises magnetic concentrating sheets arranged on a first side and a second side of the magnetic field sensing unit, wherein the first side and the second side are two opposite sides of the magnetic field sensing unit, a connection direction from the first side to the second side is the same as or opposite to the sensitive direction of the magnetic field sensing unit, and the magnetic concentrating sheets are configured to enhance a magnetic field signal generated by the current conductor and a signal-to-noise ratio of the magnetic isolator.

9. The magnetic isolator according to claim 8, wherein a material of the magnetic concentrating sheets and the shielding layer comprises at least one of permalloy, industrial pure iron, and ferrite.

10. The magnetic isolator according to claim 1, wherein
a silicon substrate, a quartz substrate, or a glass substrate is employed for the substrate, and the isolation dielectric comprises at least one of aluminum oxide, silicon oxide, silicon nitride, polyimide, and benzocyclobutene.

* * * * *